United States Patent [19]

Robichon et al.

[11] Patent Number: 4,833,426
[45] Date of Patent: May 23, 1989

[54] CONTROLLABLE FREQUENCY, TEMPERATURE COMPENSATED PIEZOELECTRIC OSCILLATOR OF HIGH SPECTRAL PURITY

[75] Inventors: Gilles Robichon, Argenteuil; Didier Parly, Ermont, both of France

[73] Assignee: Compagnie D'Electronique et De Piezo-Electricite C.E.P.E., Argenteuil, France

[21] Appl. No.: 194,440

[22] Filed: May 16, 1988

[30] Foreign Application Priority Data

May 22, 1987 [FR] France .................. 87 07207

[51] Int. Cl.⁴ .......................... H03B 5/36; H03L 1/02
[52] U.S. Cl. .............................. 331/158; 331/116 R; 331/176; 331/177 V
[58] Field of Search ............. 331/66, 116 R, 116 FE, 331/158, 159, 176, 177 R, 177 V; 332/16 T, 26, 30 V; 455/255, 257, 258, 261, 262, 264

[56] References Cited

U.S. PATENT DOCUMENTS 3,831,111 8/1974 Lafferty .................. 331/116 R
4,088,968 5/1978 Pradal et al. ............. 331/177 V X

FOREIGN PATENT DOCUMENTS 2936378 3/1981 Fed. Rep. of Germany .
6097702 5/1985 Japan .
2038125 7/1980 United Kingdom .

OTHER PUBLICATIONS

Toute L'Electronique, No. 450, Jan. 1980, pp. 13-26, Paris, G. Mourier "Les Oscillateurs pilotes modulaires".
IEEE Trans. on Instru. and Meas., vol. IM-28, No. 3, Sep. 1979, pp. 188-193; J. Vanier, "Transfer of Frequency Stability from . . . "

Primary Examiner—David Mis
Attorney, Agent, or Firm—Roland Plottel

[57] ABSTRACT

A temperature-compensated piezoelectric oscillator of high-spectral purity, capable of being controlled in frequency, consists of a compensation circuit, a processing circuit, a phase-shifting circuit, containing the piezoelectric resonator, and an oscillating circuit. To obtain high spectral purity, it is proposed to use a low-pass filter, placed between the compensation circuit and one of the inputs of the processing circuits, to process the signal coming from the compensation circuit. This filter eliminates the influence of the temperature noise coming from the compensation circuit. The invention can be applied to controllable frequency, temperature compensated piezoelectric oscillators where high spectral purity is sought.

9 Claims, 2 Drawing Sheets

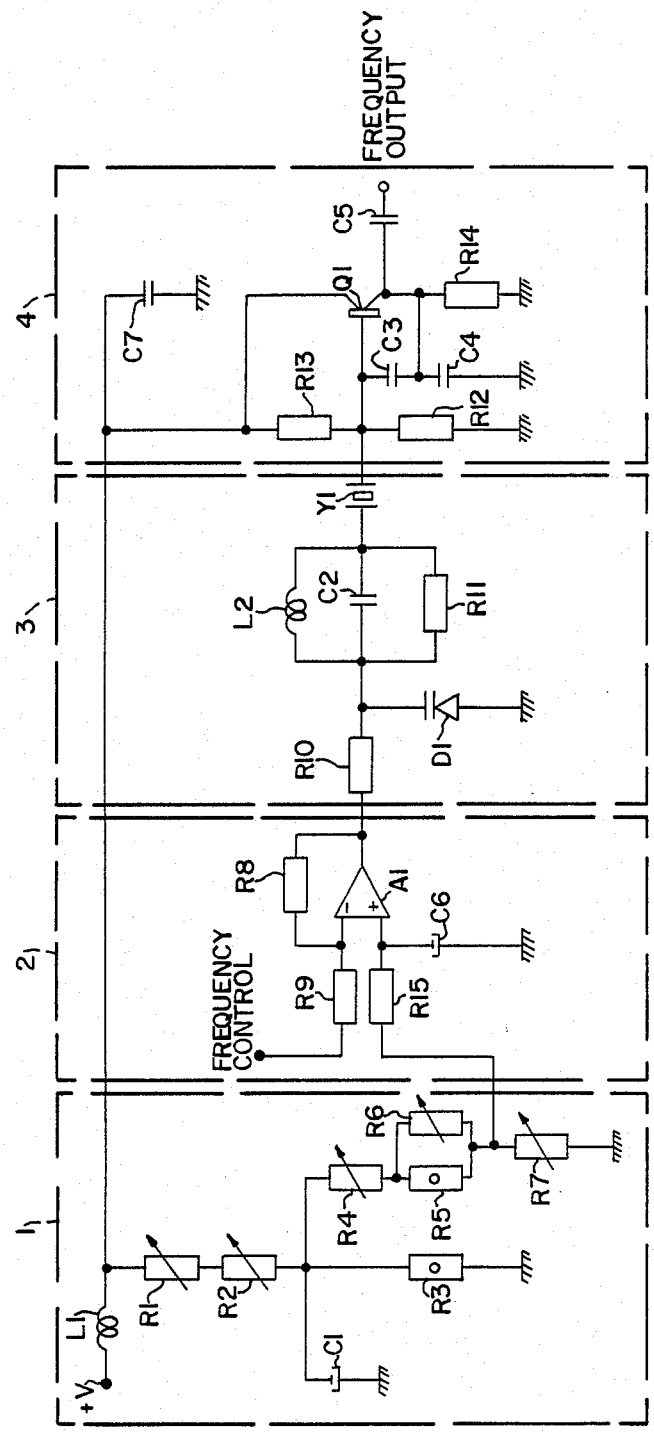
FIG_1

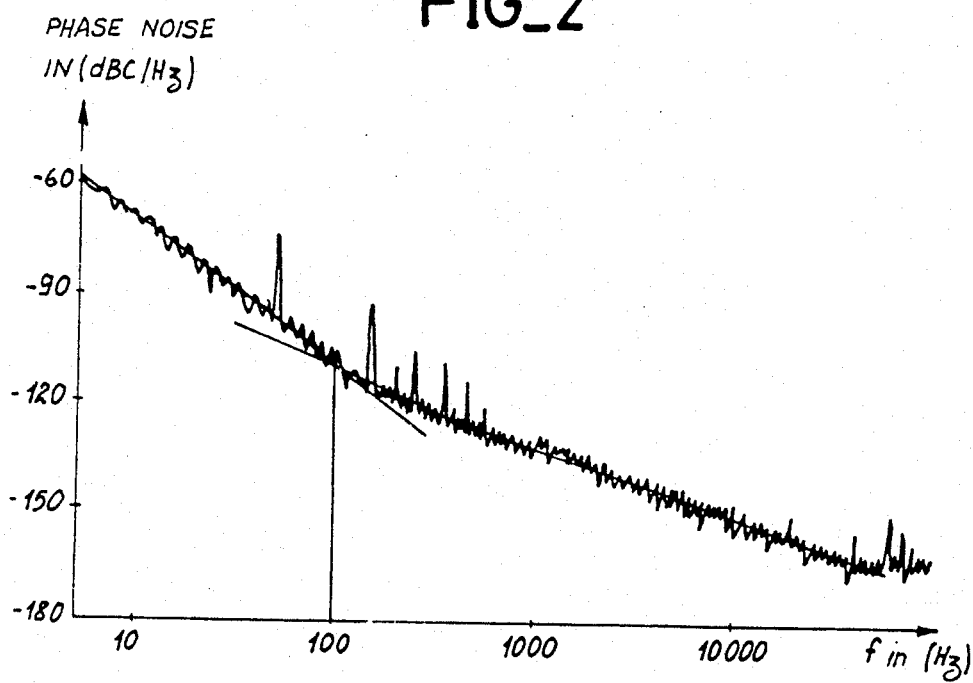
FIG_2
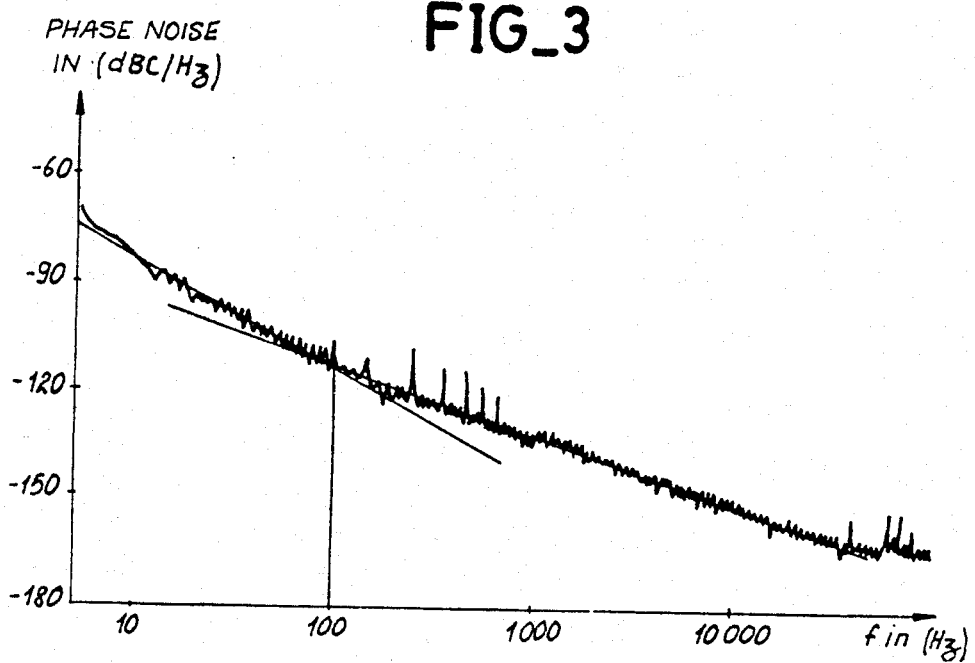
FIG_3

CONTROLLABLE FREQUENCY, TEMPERATURE COMPENSATED PIEZOELECTRIC OSCILLATOR OF HIGH SPECTRAL PURITY

BACKGROUND OF THE INVENTION

1. Field of the Invention

The present invention relates to temperature compensated piezoelectric oscillators of high spectral purity and capable of being controlled in frequency.

2. Description of the Prior Art

Prior art temperature compensated, controllable frequency piezoelectric oscillators consist of a temperature compensation circuit, a processing circuit, a first input of which takes the signal coming from the temperature compensating circuit and the second input of which takes a frequency control signal, a phase-shifting circuit for frequency control comprising the piezoelectric resonator followed by an oscillator circuit.

The frequency stability of a piezoelectric oscillator is a highly important parameter. In radio communications, the time bases should be as precise as possible, in the long term as well as in the short term. This means that the output frequency of the oscillator should vary as little as possible.

Ideally, a sinusoidal voltage is written as follows:

$$V(t) = V_o \sin 2\pi f_o t$$

where Vo is the amplitude of the voltage, and fo is the frequency. However, in practice, this voltage becomes:

$$V(t) = (V_o + \epsilon(t)) \sin (2\pi f_o t + \Delta(t))$$

because of unwanted phenomena.

$\epsilon(t)$ represents the amplitude variation, $\Delta(t)$ represents the phase variation or phase noise.

Since the phase and frequency are related, the frequency stability and phase noise are also related.

The phase noise can be measured by using a low frequency spectrum analyzer in the method where the phase of a reference oscillator is automatically locked into an oscillator to be tested. This phase noise decreases when the frequency in relation to the carrier increases.

An oscillator with high spectral purity will therefore have a phase noise, near the carrier, which is as low as possible.

In a piezoelectric oscillator, there are many parameters that cause frequency variations: these parameters are temperature, vibrations, shocks, acceleration, pressure, etc. Among these causes, temperature effects induce high frequency variation.

The thermally caused noise spectrum is found to a considerable extent in the low frequency phase noise spectrum.

SUMMARY OF THE INVENTION

The present invention is aimed at coping with this disadvantage by proposing a piezoelectric oscillator comprising, at the output of the compensating circuit, filtering means to remove noise of thermal origin.

More precisely, the invention relates to a piezoelectric oscillator of high spectral purity, which is temperature compensated and can be controlled in frequency, comprising a temperature compensation circuit, a processing circuit, a first input of which takes the signal coming from the temperature compensating circuit and a second input of which takes a frequency control signal, a phase-shifting circuit for frequency control comprising the piezoelectric resonator, the input of which is connected to the output of the processing circuit and the output of which is connected to an oscillating circuit so as to act on the resonance frequency of the oscillating circuit, wherein the filtering means, located between the output of the compensation circuit and the first input of the processing circuit, are used to eliminate the noise of thermal origin, coming from the compensation circuit.

BRIEF DESCRIPTION OF THE DRAWINGS

The invention will be better understood from the following description and figures, of which:

—FIG. 1 shows the diagram of an oscillator according to the invention;

—FIG. 2 is a graph showing the phase noise as a function of frequency for a prior art oscillator;

—FIG. 3 is a graph showing the phase noise as a function of frequency for an oscillator according to the invention.

DESCRIPTION OF THE PREFERRED EMBODIMENTS

FIG. 1 shows the complete diagram of an oscillator according to the invention.

This diagram can be split up into four parts. A first part is a known type of compensating circuit 1. It consists of thermistors, R3, R5, resistors R1, R2, R4, R6, R7, and the capacitor C1. This heat-sensitive compensation circuit 1 can be used to reduce any frequency divergence caused by a temperature variation. The resistors, R1, R2, R4, R6, R7, can be adjusted manually to obtain a minimum output frequency variation at a given temperature.

The adjusting is according to the supply voltage +V designed for the temperature range considered. This supply voltage is filtered by the self-induction coil L1 and the capacitor C7.

A second part of the diagram is a processing circuit 2. It consists of a operational amplifier A1, with differential inputs, mounted as a subtractor. The input with reversal is driven through a resistor R9 by means of a frequency control voltage. A resistor R8 provides the feedback. The input without reversal is driven by the output voltage of the compensation circuit through a filter. In the case of FIG. 1, this filter is a low-pass filter consisting of a resistor R15 and a capacitor C6. This low-pass filter removes the influence of the thermally caused noise coming from the thermistors at low frequency.

This processing is all the more efficient as the cut-off frequency of the low-pass filter is low. Various measurements have shown that the influence of the filtering starts having an effect for cut-off frequencies of about 5 Hz.

A third part of the diagram is a phase-shift circuit 3, consisting of a variable capacitance diode D1, called a Varicap diode, biased through a resistor R10 by the direct output voltage of the amplifier A1. This voltage provides for frequency control.

The voltage at the terminals of this diode D1 is applied to an oscillating parallel circuit consisting of a self-induction coil L2, a capacitor C2 and a resistor R11. A peizoelectric resonator Y1 is series connected with the parallel circuit R11, L2, C2.

The oscillating circuit L2, C2, R11 and the piezoelectric resonator Y1 give the pilot frequency. A fourth part of the diagram is a Clapp type oscillator circuit, for example series-connected with the resonator Y1. This oscillator circuit 4 has a transistor Q1, the base of which is biased by a bridge of resistors R12, R13.

A capacitance bridge C1, C3, connects the base of the transistor Q1 to the ground. The mid-point of this capacitance bridge is connected to the emitter of the transistor Q1.

The output of the oscillating circuit is at a resistor R14 through a connecting capacitor C5.

FIG. 2 shows the variation of phase noise, as a function of frequency, of a prior art piezoelectric oscillator having no filtering circuit. The phase noise is shown on a logarithmic scale and is expressed in DbC/Hz, i.e. in sub-carrier decibels per hertz. This depiction of the phase noise has been done by the method wherein the phase of a reference oscillator is automatically locked into the oscillator to be tested. In this depiction, between 0 and 100 Hz, the phase noise decreases rapidly. In this range of frequencies, the slope of the curve is $-40$ decibels per decade or about $f^{-4}$. Beyond 100 Hz, the slope of the curve is no more than $-20$ decibels per decade.

FIG. 3 shows the phase noise, in the same way, as a function of the frequency of a piezoelectric oscillator according to the invention with the filtering circuit. Between 0 and 100 Hz, the phase noise is far lower than in the above example.

The slope of the curve is no more than $-30$ decibels per decade. There is no change for frequencies above 100 Hz. The thermally caused noise coming from the compensation circut has been eliminated in the phase noise.

The filtering circuit gives an appreciable gain between 0 and 100 Hz. At 10 Hz, for example, the gain is 12 decibels. These results are obtained with a low-pass filter having, for example, a resistance $R15 = 10\ k\Omega$ and a capacitance $C6 = 22\ \mu F$. The corresponding cut-off frequency is 0.7 Hz.

What is claimed is:

1. A piezoelectric oscillator of high spectral purity, temperature compensated and capable of being controlled in frequency, comprising a temperature compensation circuit, a processing circuit, a first input of which takes the signal coming from the temperature compensating circuit and a second input of which takes a frequency control signal, a phase-shifting circuit for frequency control comprising the piezoelectric resonator, the input of which is connected to the output of the processing circuit and the output of which is connected to an oscillating circuit so as to act on the resonance frequency of the oscillating circuit, wherein filtering means, located between the output of the compensation circuit and the first input of the processing circuit, are used to eliminate the noise of thermal origin, coming from the compensation circuit.

2. An oscillator according to claim 1, wherein the means for filtering the thermally caused noise consist of a low-pass filter.

3. An oscillator according to claim 2 wherein the low-pass filter is of the R.C. type.

4. An oscillator according to claim 2 wherein the cut-off frequency of the low-pass filter is lower than 5 Hz.

5. An oscillator according to claim 1 wherein the compensation circuit consists of thermistors and resistors.

6. An oscillator according to claim 1 wherein the processing circuit is an operational amplifier mounted as a subtractor.

7. An oscillator according to claim 1 wherein the phase-shifting circuit comprises a Varicap diode.

8. An oscillator according to claim 1 wherein the oscillator circuit is of the Clapp type.

9. An oscillator according to claim 3 wherein the compensation circuit consists of thermistors and resistors, the processing circuit being an operational amplifier mounted as a subtractor, the phase-shifting circuit comprising a Varicap diode, the oscillator circuit being of the Clapp type.

* * * * *